(12) United States Patent
Tsai et al.

(10) Patent No.: US 7,265,056 B2
(45) Date of Patent: Sep. 4, 2007

(54) METHOD FOR FORMING NOVEL BARC OPEN FOR PRECISION CRITICAL DIMENSION CONTROL

(75) Inventors: Ming Huan Tsai, Hsinchu (TW); Ru Chian Chiang, Tainan (TW); Hun Jan Tao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 307 days.

(21) Appl. No.: 10/754,178

(22) Filed: Jan. 9, 2004

(65) Prior Publication Data

US 2005/0153538 A1  Jul. 14, 2005

(51) Int. Cl.
*H01L 21/302* (2006.01)
*H01L 21/461* (2006.01)

(52) U.S. Cl. .............. 438/725; 438/706; 438/710; 257/E21.486

(58) Field of Classification Search ........ 438/706, 438/710, 725; 257/E21.486
See application file for complete search history.

(56) References Cited

U.S. PATENT DOCUMENTS

| 5,801,077 A | 9/1998 | Chor et al. |
| 5,925,577 A | 7/1999 | Solis |
| 6,028,001 A | 2/2000 | Shin |
| 6,040,247 A | 3/2000 | Chung |
| 2003/0148224 A1* | 8/2003 | Vahedi et al. ........... 430/314 |
| 2004/0072443 A1* | 4/2004 | Huang et al. ........... 438/710 |

* cited by examiner

Primary Examiner—Bradley K. Smith
(74) Attorney, Agent, or Firm—Haynes and Boone, LLP

(57) ABSTRACT

A method for forming an opening in a semiconductor device is provided. In one embodiment, a bottom anti-reflective coating (BARC) layer is formed overlying an insulation layer of a substrate. A patterned photoresist layer including at least one opening therein is formed overlying the BARC layer. The BARC layer and the insulation layer are etched by employing the patterned photoresist layer as a mask in a process comprising: positioning the semiconductor device into a chamber and introducing a first gas including fluorocarbon gas for etching and polymer formation; introducing into the chamber a second gas containing oxygen for polymer formation control; partial etching the BARC layer defined by the at least one opening and subsequently forming a polymer layer on the inside of the at least one opening; repeating the step of partial etching and polymer formation to form the at least one opening in the BARC layer; and continuing the step of partial etching and polymer formation to form the at least one opening in the insulation layer.

26 Claims, 4 Drawing Sheets

METHOD FOR FORMING NOVEL BARC OPEN FOR PRECISION CRITICAL DIMENSION CONTROL

BACKGROUND

The present invention relates generally to the formation of integrated circuit structures, and particularly to methods for forming novel BARC opens for precision critical dimension control.

As semiconductor wafers continually progress to higher density chips with shrinking geometries of 0.13 µm and below, the materials and processes used in wafer fabrication are undergoing dramatic changes. There is a concurrent scaling of all device features to maintain electrical performance. This trend is made possible by the development of new manufacturing techniques as well as innovative improvements of existing procedures thereby extending their utility further towards miniaturization and higher density.

One area where the limits of technology are constantly tested is the formation of contact and via openings in insulating or dielectric layers on semiconductor substrates. These openings pass through the various dielectric layers and are filled with a metal, such as tungsten to form an electrical connection at the silicon surface between the devices in the silicon wafer and the first metal layer in the case of contacts; and, in the case of vias, they form an electrical pathway from one metal layer to the metal layer either above or below it.

Contact and via openings having submicron geometries represent one of the smallest microlithographically defined features on the integrated circuit. The openings are typically formed by anisotropic etching through the insulating layer using a patterned photoresist mask and can provide deep vertical openings having high-aspect ratios (ratio of height to width for an opening).

One desirable etch sidewall profile for submicron feature sizes is an anisotropic profile, where the rate of etching is in only one direction perpendicular to the wafer surface. As there is very little lateral etching activity, the benefit is that this leaves vertical sidewalls, permitting a higher packing density of etched features on the chip. Anisotropic etch is critical for the patterning of submicron devices with small linewidths and features. Advanced IC applications usually require 88 to 89° vertical sidewall profiles.

One goal of anisotropic etching is to reproduce the image of a mask on the wafer surface with a high degree of integrity to ensure critical dimension and profile control. Unfortunately, several drawbacks may occur in the formation of contact and via openings as a result of anisotropic etching. One such drawback is the occurrence of etch bias, which is a measure of the change in linewidth or space of a critical dimension (CD) after performing an etch process. It is usually caused by undercutting and/or overetching which occur when the etch process removes excessive material below the mask, causing the top surface of the etched film to be recessed from the resist edge.

Additionally, current photolithography tools may not be able to achieve the high resolution critical for 0.12 µm or below wafer features such as contact or via openings and these tools are unable to reduce photoresist degradation during the anisotropic etching process.

Further, there is the high cost associated with the use of photolithography equipment such as lens, scanner and stepper tools. Photolithography require lens with higher numerical aperture (NA) to achieve better resolution for deep submicron features. However, higher numerical aperture lens require the purchase of current model scanner tools which will lead to higher costs.

For these reasons and other reasons that will become apparent upon reading the following detailed description, there is a need for a method of controlling the critical dimensions in the formation of contact, via and damascene openings in insulating or dielectric layers on wafers.

SUMMARY

The present invention provides methods for forming openings in semiconductor devices. In one exemplary embodiment, a bottom anti-reflective coating (BARC) layer is formed overlying an insulation layer of a substrate. A patterned photoresist layer including at least one opening therein is formed overlying the BARC layer. The BARC layer and the insulation layer are etched by employing the patterned photoresist layer as a mask in a process comprising: positioning the semiconductor device into a chamber and introducing a first gas including fluorocarbon gas for etching and polymer formation; introducing into the chamber a second gas containing oxygen for polymer formation control; partial etching the BARC layer defined by the at least one opening and subsequently forming a polymer layer on the inside of the at least one opening; repeating the step of partial etching and polymer formation to form the at least one opening in the BARC layer; continuing the step of partial etching and polymer formation to form the at least one opening in the insulation layer; and subsequently removing the photoresist layer and the BARC layer such that a conductive layer is subsequently formed in the opening in the insulation layer to electrically contact an active region of a transistor.

In another exemplary embodiment, a BARC layer is formed overlying an insulation layer of a substrate. A patterned photoresist layer including at least one opening therein is formed overlying the BARC layer. The BARC layer and the insulation layer are etched by employing the patterned photoresist layer as a mask in a process comprising: positioning the semiconductor device into a chamber and introducing a first gas including fluorocarbon gas for etching and polymer formation; introducing into the chamber a second gas containing oxygen for polymer formation control; partial etching the BARC layer defined by the at least one opening and subsequently forming a polymer layer on the inside of the at least one opening; repeating the step of partial etching and polymer formation to form the at least one opening in the BARC layer; continuing the step of partial etching and polymer formation to form the at least one opening in the insulation layer; and subsequently removing the photoresist layer and the ARC layer such that a conductive layer is subsequently formed in the opening in the insulation layer to electrically contact a metal layer formed above the substrate.

BRIEF DESCRIPTION OF THE DRAWINGS

The features, aspects, and advantages of the present invention will become more fully apparent from the following detailed description, appended claims, and accompanying drawings in which:

DESCRIPTION

In the following description, numerous specific details are set forth to provide a thorough understanding of the present invention. However, one having an ordinary skill in the art will recognize that the invention can be practiced without these specific details. In some instances, well-known circuits, structures and techniques have not been shown in detail to avoid unnecessarily obscuring the present invention.

Reference will now be made in detail to the present preferred embodiments of the present invention, examples of which are illustrated in the accompanying drawings.

Figure 1:
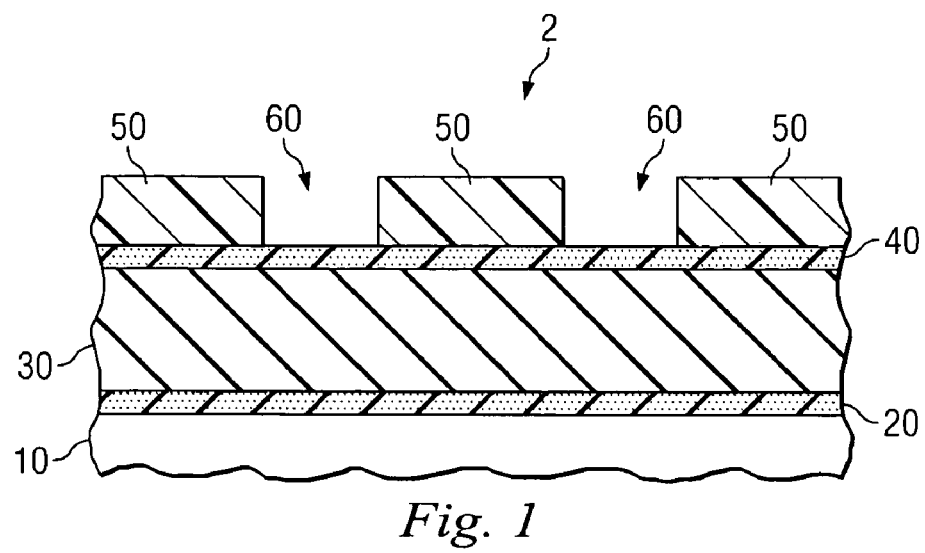
FIG. 1 is a schematic cross-sectional view of a formation of an integrated circuit structure showing a patterned photoresist layer formed upon a bottom anti-reflective coating (BARC) layer overlying a low-k dielectric layer of a substrate according to one embodiment of the present invention.

FIGS. 1 through 6 illustrate schematic cross-sectional views of a formation of an integrated circuit structure, by way of example, but not by way of limitation, according to one exemplary embodiment of the present invention. As shown in FIG. 1, an integrated circuit structure 2 showing a patterned photoresist layer 50 formed upon an anti-reflective coating layer 40 overlying a low-k dielectric layer 30 of a substrate 10 is provided. It is understood that the type of the integrated circuit structure 2 is a design choice dependent on the fabrication process being employed. For instance, integrated circuit structure 2 may be a metal interconnect structure as employed in the fabrication of metal lines and plugs of integrated circuits.

Substrate 10 may include a substrate as employed within the microelectronic fabrication, wherein the substrate has formed thereupon and/or thereover any of several additional microelectronic layers as are conventionally employed within the microelectronic fabrication. These layers may include, for example, conductor materials, semiconductor materials and dielectric materials. Subsequent to the formation of substrate 10, an optional etch stop layer 20 may be formed thereabove. Etch stop layer 20 prevents substrate 10 from being damaged by a subsequent etching step and simultaneously prevents substrate 10 from being oxidized by exposure to an oxygen containing environment. Etch stop layer 20 may be formed by conventional chemical vapor deposition using an etch stop material such as, for example, silicon nitride.

Next, low-k dielectric layer 30 is formed on etch stop layer 20. Low-k dielectric layer 30 may include any suitable dielectric material conventionally employed in the manufacture of semiconductor devices, including low-k materials having a dielectric constant of about 3.0 or less to insulate one conductive layer from another. Low-k dielectric layer 30 may include interlayer dielectrics (ILDs) or intermetal dielectrics (IMDs) and preferably comprises silicon dioxide. The formation of such layers or films is common in the semiconductor industry and the deposition procedures are familiar to those in the art.

A bottom anti-reflective coating (BARC) layer 40 is next deposited over low-k dielectric layer 30 before a photoresist layer to suppress unintended light reflection from a reflective layer that is below the resist. BARC layer 40, preferably an organic BARC layer, is conventionally spin-coated on the wafer in the same manner as the photoresist layer. BARC layer 40 is typically deposited on the wafer as a thin layer, typically from around 200 to 2000 angstroms, depending on the type of ARC (bottom vs. top ARC) and material (organic vs. inorganic) used. BARC layer 40 also acts as part of the photoresist mask and along with photoresist layer 50 will be subsequently removed after the completion of the photolithography process step.

Next, a photoresist layer 50 is deposited by conventional methods such as, for example, spin coating on BARC layer 40 at a thickness of from about 1000 angstroms to about 1 μm. The photoresist layer 50 is patterned to define openings 60 using well-known photolithographic processes, preferable high resolution (less than 0.25) deep UV (DUV) photolithography for optimum pattern resolution. Patterned photoresist layer 50 will subsequently be employed as an etch mask in an etch chamber to form opening 60 in BARC layer 40 and low-k dielectric layer 30. In one exemplary embodiment, after an etch procedure, a contact opening defined by opening 60 in photoresist layer 50 is formed in BARC layer 40, low-k dielectric layer 30 and optionally etch stop layer 20. The contact opening exposes underlying active regions of a transistor (not shown) in substrate 10 for electrical contact with a subsequently formed conductive plug in the contact opening. In another exemplary embodiment, after an etch process, a via opening defined by opening 60 in photoresist layer 50 is formed in BARC layer 40, low-k dielectric layer 30 and optionally etch stop layer 20. The via opening exposes an underlying metal layer (not shown) in substrate 10 for electrical contact with a subsequently formed conductive plug in the via opening.

Figure 2:
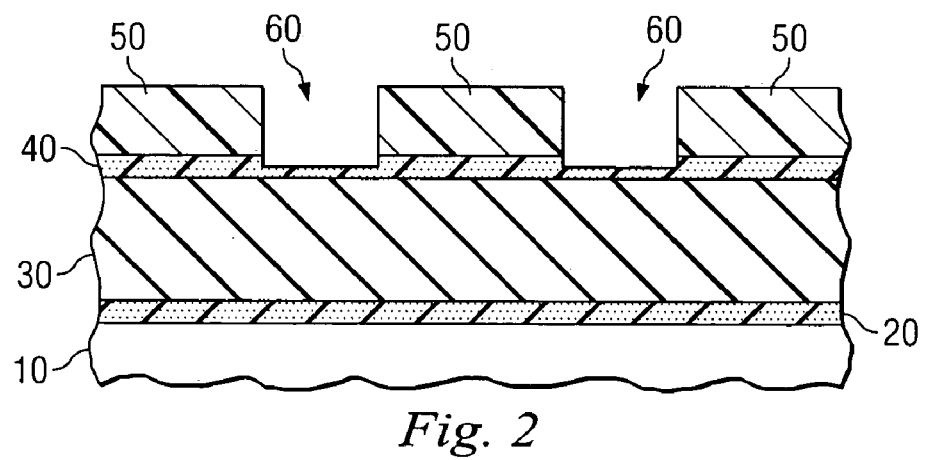
FIG. 2 is a schematic cross-sectional view of the structure of FIG. 1 showing partial etching of the top surface of the BARC layer according to one embodiment of the present invention.

Referring now to FIG. 2, integrated circuit structure 2 is loaded into a plasma dry etch chamber, such as, for example, an Reactive ion etch (RIE) etcher or a High-density plasma etcher. The etching plasma process is based on fluorocarbon chemistry. Fluorocarbon is a fluorinated hydrocarbon. It has one or more of the hydrogen atoms in a hydro-carbon molecule replaced by fluorine (F). In this manner, many gases are sources of fluorine, such as $CF_4$, $C_3F_8$, $C_4F_8$, and $CHF_3$. Common gases are tetrafluoromethane ($CF_4$), which has a high etch rate and trifluoromethane ($CHF_3$) which has a high rate of polymer formation.

As shown in FIG. 2, the surface of BARC layer 40 is partially etched or "opened" in the plasma dry etch chamber employing patterned photoresist layer 50 as an etch mask. Often, during a BARC open process, the resist pattern is easily distorted. By partial etching the BARC layer and subsequently depositing good step coverage polymer in the sidewall of the etched feature, the resist pattern is protected from distortion and the integrity of the feature pattern is thus preserved. The etching is accomplished using fluorocarbon etchant gases having the general formula of $C_xF_y$, with subscripts x and y in $C_xF_y$ ranging from 0 to 9; and $C_xH_yF_z$, with subscripts x, y, and z ranging from 0 to 9. Examples of such gases comprise $CF_4$, $C_2F_6$, $C_4F_8$, $CHF_3$, $CH_2F_2$ or $CH_3F$ or combinations thereof. However, it is understood that other gases that include one or more of the properties or similar properties of fluorocarbon gases may also be used in the present invention.

In one exemplary embodiment, etchant gases including $C_4F_6$ at 5 to 20 SCCM (standard cubic centimeters per minute) or thereabout and/or $CF_4$ at 10 to 200 SCCM or thereabout, $O_2$ at 5 to 50 SCCM or thereabout, Argon at 100-2000 SCCM or thereabout was used to etch BARC layer in a chamber pressure of from about 1 mTorr to about 300 mTorr, at a temperature of about 20 to 200° C., at a radio frequency power of from about 300 watts to about 5000 watts, and at a radio frequency of from about 400 kHz to about 162 MHz.

Small concentrations of oxygen-containing gases may also be added in the etch chamber to improve the etch rate. At greater concentrations of up to about 20% $O_2$, there is more rapid etching of BARC layer 40 and the subsequent etching of low-k dielectric layer 30. In one exemplary embodiment for the BARC open step, the etchant gases consist of $O_2/C_xF_y/Ar$ with $O_2$ part to $C_xF_y$ and Ar being about 1:1-10:1-1000, with a chamber pressure of from about 1 mTorr to about 1 Torr, at a temperature of about 60 to 200° C., at a radio frequency power to sustain plasma of from about 100 watts to about 5000 watts and at a radio frequency power to control ion bombardment from about 100 watts to about 5000 watts. In another exemplary embodiment for the BARC open step, the etchant gases consist of $O_2/C_xF_y/C_xH_yF_z/N_2/Ar$ with $O_2$ part to $C_xF_y$, $C_xH_yF_z$, $N_2$ and Ar being about 1:1-10:1-10:1-10:1-1000, with a chamber pressure of from about 1 mTorr to about 1 Torr, at a temperature of about 60 to 200° C., at a radio frequency power to sustain plasma of from about 100 watts to about 5000 watts and at a radio frequency power to control ion bombardment from about 100 watts to about 5000 watts.

Figure 3:
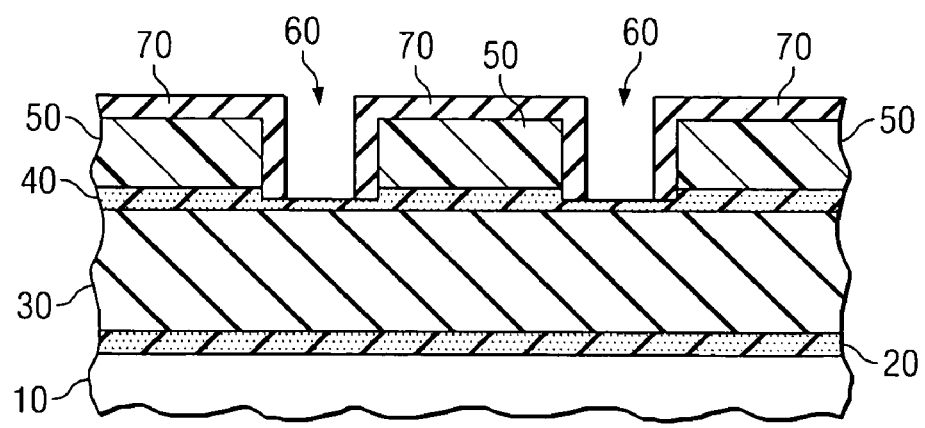
FIG. 3 is a schematic cross-sectional view of the structure of FIG. 2 showing polymer layer formation on the inside sidewalls of the patterned photoresist layer and the BARC layer and on top of the patterned photoresist layer according to one embodiment of the present invention.

As the patterned photoresist layer 50 erodes during the plasma dry etch process, carbon from the patterned photoresist layer 50 reacts with the etchant gases to form polymer 70 which deposits along the top of patterned photoresist layer 50, on the sidewalls of patterned photoresist layer 50 and on the bottom of opening 60. By keeping the ion bombardment low in the polymer deposition step, polymer deposition on the bottom of opening 60 is reduced. A benefit of polymer formation on the sidewalls of patterned photoresist layer 50 is that polymer 70 reduces photoresist degradation during the etching process. This is important to reproduce the image of the patterned photoresist layer 50 on the substrate 10 with a high degree of integrity. FIG. 3 shows polymer 70 deposited on the sidewalls of opening 60 being etched in BARC layer 40 to form an etch-resistant film that prevents lateral etching. This produces highly anisotropic features because it blocks the etching of the sidewall, thus increasing the etch directionality. The result is the formation of smooth, near vertical openings 60 and thus better control of critical dimensions of patterned structures.

Oxygen containing gases such as $O_2$, CO, $CO_2$, NO, $NO_2$ or $N_2$ are also added in the etch chamber to control the rate of polymer formation thereby achieving better step coverage of the etched feature. The amount of polymer deposited on the sidewalls of opening 60 may be controlled by adjusting the flow rate of oxygen containing gases, the etching time and the deposition time as is known to those skilled in the art. In one exemplary embodiment for polymer deposition, the gases consist of $O_2/C_xH_yF_z/Ar$ with $O_2$ part to $C_xH_yF_z$ and Ar being about 1:1-10:1-1000, with a chamber pressure of from about 1 mTorr to about 1 Torr, at a temperature of about 60 to 200° C., at a radio frequency power to sustain plasma of from about 100 watts to about5000 watts and at a radio frequency power to control ion bombardment from about0 watt to about 300 watts.

Buffer gases such as Ar, He, Kr, and Xe may also be optionally added to the etchant gases for diluent and ion density control. Argon (Ar), for example, has a relatively high mass that is used for physical etching (sputtering). Helium (He), on the other hand, has a low mass and is used to diminish the etchant gas concentration (referred to as a diluent) to enhance plasma uniformity. The respective gas flow rates and etching parameters are optimized by etchant and parameter selection to obtain high etch rate selectivities for the BARC layer 40 with respect to the patterned photo resist layer 50. These optimization procedures are well-known to those skilled in the art.

Figure 4:
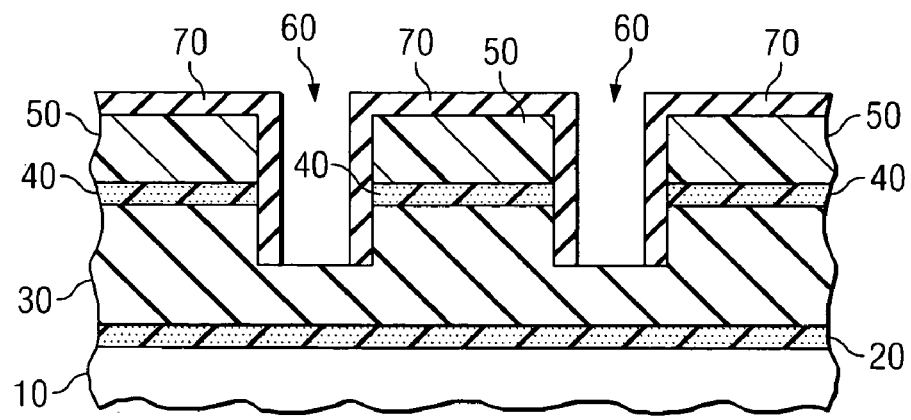
FIG. 4 is a schematic cross-sectional view of the structure of FIG. 3 showing the continued etching and subsequent polymer layer formation through the BARC layer and partially through the low-k dielectric layer according to one embodiment of the present invention.
Figure 5:
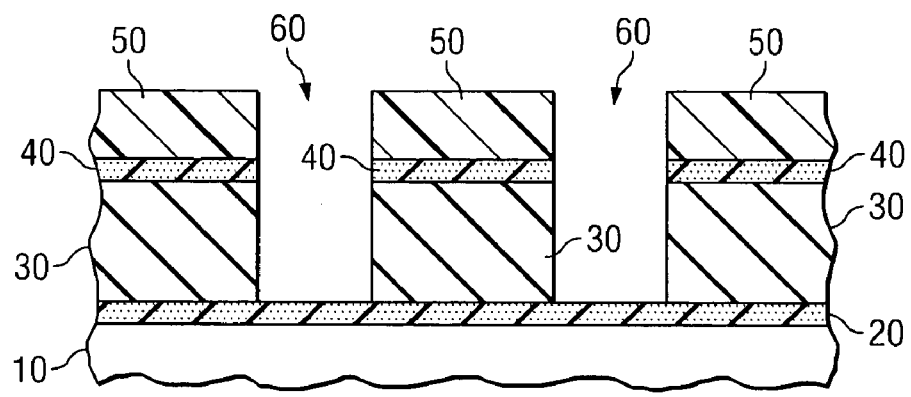
FIG. 5 is a schematic cross-sectional view of the structure of FIG. 4 showing etching through the BARC and low-k dielectric layers and the subsequent removal of the polymer layers according to one embodiment of the present invention.

The process of partial etching and subsequent polymer formation is repeated to form opening 60 in BARC layer 40. FIG. 4 is a schematic cross-sectional view of the structure of FIG. 3 showing the continued etching and subsequent polymer layer formation to form opening 60 through BARC layer 40 and to form opening 60 partially through the low-k dielectric layer 30. When the processes of partial etching and subsequent polymer formation are continued, opening 60 is formed through low-k dielectric layer 30 up to etch stop layer 20 as depicted in FIG. 5. Polymer layers formed in opening 60 are subsequently removed. The repeated processes of partial etching and polymer formation result in the formation of smooth, near vertical openings 60 and thus better control of critical dimensions of patterned structures having high aspect ratios.

Figure 6:
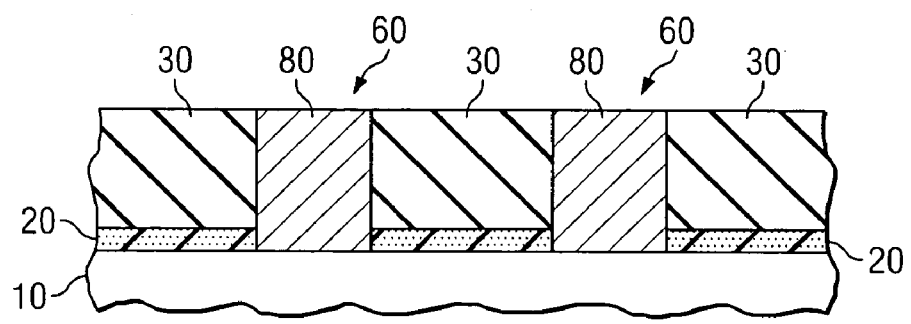
FIG. 6 is a schematic cross-sectional view of the structure of FIG. 5 showing etching of a portion of an etch stop layer, removal of the patterned photoresist and the BARC layers and the subsequent deposition and CMP of conductive layers in the contact or via openings according to one embodiment of the present invention.

Turning next to FIG. 6, a schematic cross-sectional view of the structure of FIG. 5 shows etching of portions of etch stop layer 20 to expose substrate 10. Both patterned photoresist layer 50 and BARC layer 40 are removed once etch is complete by conventional wet strip or plasma ashing. Next, a conductive material such as for example, copper, to form conductive layer 80 is deposited into opening 60 to electrically contact an underlying metal layer (not shown) in the case of filling a via; or the conductive layer 80 is deposited into opening 60 to electrically contact an underlying active region of a transistor (not shown) in the case of filling a contact hole. Conductive layer 80 is deposited by conventional deposition techniques, such as electrochemical deposition (ECD), PVD, or CVD and forms an overburden. Next, a planarization step such as by conventional chemical mechanical planarization (CMP) is conducted to remove the overburden and planarize conductive layer 80. These procedures are well-known and widely practiced by those skilled in the art.

Another exemplary embodiment of the present invention is schematically illustrated, by way of example, but not by way of limitation, in FIGS. 7 through 12.

Figure 7:
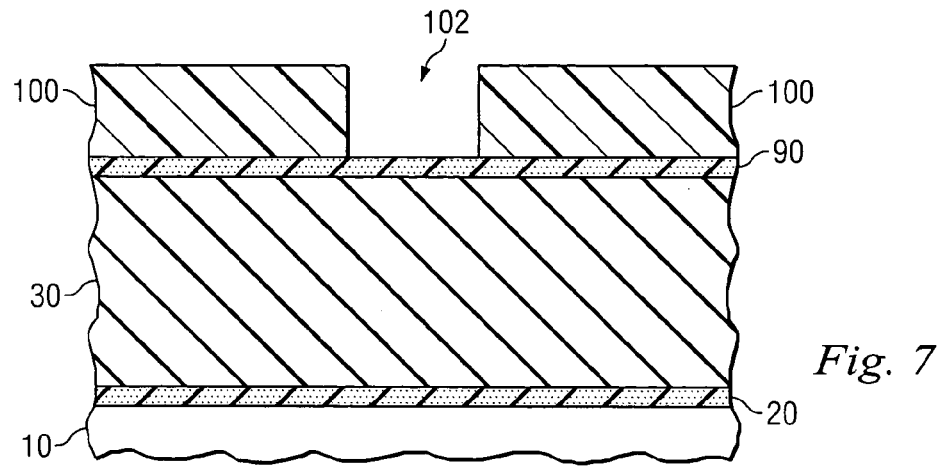
FIG. 7 is a schematic cross-sectional view of a formation of a dual damascene structure showing a first patterned photoresist layer formed upon a first BARC layer overlying a low-k dielectric layer of a substrate according to one embodiment of the present invention.

FIG. 7 is a schematic cross-sectional view of a formation of a dual damascene structure showing a first patterned photoresist layer 100 formed upon a first BARC layer 90 overlying a low-k dielectric layer 30 on a substrate 10. Substrate 10 may include a substrate as employed within the microelectronic fabrication, wherein the substrate has formed thereupon and/or thereover any of several additional microelectronic layers as are conventionally employed within the microelectronic fabrication. These layers may include, for example, conductor materials, semiconductor materials and dielectric materials. Subsequent to the formation of substrate 10, an optional etch stop layer 20 may be formed thereabove. Etch stop layer 20 prevents substrate 10 from being damaged by a subsequent etching step and simultaneously prevents substrate 10 from being oxidized by exposure to an oxygen containing environment. Etch stop layer 20 may be formed by conventional chemical vapor deposition using an etch stop material such, for example, silicon nitride.

Next, low-k dielectric layer 30 is formed on etch stop layer 20. Low-k dielectric layer 30 may include any suitable dielectric material conventionally employed in the manufacture of semiconductor devices, including low-k materials having a dielectric constant of about 3.0 or less to insulate one conductive layer from another. The formation of such layers or films is common in the semiconductor industry and the deposition procedures are familiar to those in the art.

A first bottom anti-reflective coating (BARC) layer 90 is next deposited over low-k dielectric layer 30 before a photoresist layer to suppress unintended light reflection from a reflective layer that is below the resist. First BARC layer 90, preferably an organic BARC layer, is conventionally spin-coated on the wafer in the same manner as the photoresist layer. First BARC layer 90 is typically deposited on the wafer as a thin layer, typically from around 200 to 2000 angstroms, depending on the type of ARC (bottom vs. top ARC) and material (organic vs. inorganic) used. First BARC layer 90 along with first patterned photoresist layer 100 will be subsequently removed after the completion of the photolithography process step.

Next, a first photoresist layer 100 is deposited by conventional methods such as, for example spin coating, on first BARC layer 90 at a thickness of from about 1000 angstroms to about 1 µm. The first photoresist layer 100 is patterned to define first opening 102 using well-known photolithographic processes, preferable high resolution (less than 0.25) deep UV (DUV) photolithography for optimum pattern resolution. Patterned photoresist layer 100 will subsequently be employed as an etch mask in an etch chamber to form first opening 102 in first BARC layer 90 and low-k dielectric layer 30. First opening 102 defines the via hole of the dual damascene structure that will be subsequently formed in low-k dielectric layer 30.

Figure 8:
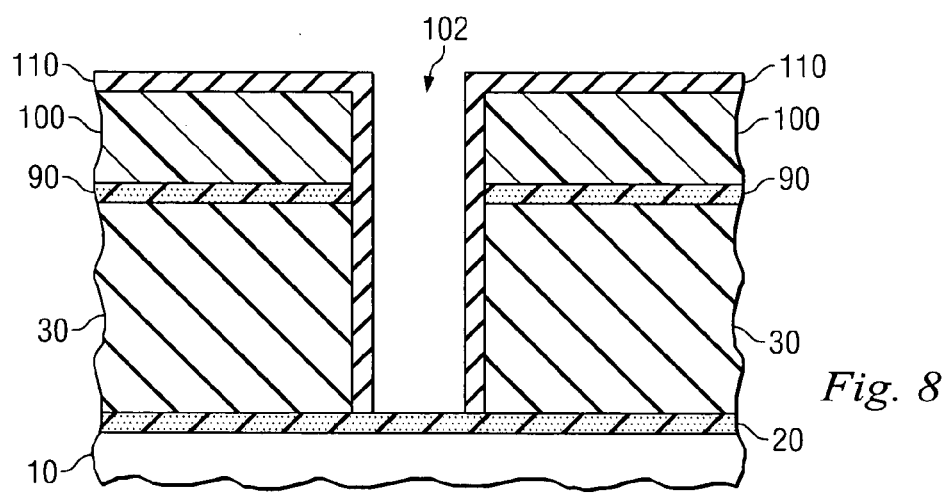
FIG. 8 is a schematic cross-sectional view of the structure of FIG. 7 showing the etching through and subsequent polymer layer formation on top of the first patterned photoresist layer and on the sidewalls of the first patterned photoresist layer, the first BARC layer and the low-k dielectric layer according to one embodiment of the present invention.

Referring now to FIG. 8, the dual damascene structure is loaded into a plasma dry etch chamber, such as, for example, a Reactive ion etch (RIE) or a High-density plasma etcher. The etching plasma process is based on fluorocarbon chemistry. Initially, the surface of first BARC layer 90 is partially etched in the plasma dry etch chamber employing first patterned photoresist layer 100 as a mask to define a to be formed via hole in low-k dielectric layer 30. The etching is accomplished using fluorocarbon etchant gases having the general formulas of $C_xF_y$, with subscripts x and y in $C_xF_y$ ranging from 0 to 9; and $C_xH_yF_z$, with subscripts x, y, and z ranging from 0 to 9. Examples of such gases comprise CF4, C2F6, C4F8, CHF3, CH2F2 or CH3F or combinations thereof. However, it is understood that other gases that include one or more of the properties or similar properties of fluorocarbon gases may also be used in the present invention.

In one exemplary embodiment, etchant gases consisting of C4F6 at 5 to 20 SCCM (standard cubic centimeters per minute) or thereabout and/or CF4 at 10 to 200 SCCM or thereabout, O2 at 5 to 50 SCCM or thereabout, Argon at 100-2000 SCCM or thereabout was used to etch BARC layer 90 in a chamber pressure of from about 1 mTorr to about 300 mTorr, at a temperature of about 20 to 200° C., at a radio frequency power of from about 300 watts to about 5000 watts, and at a radio frequency of from about 400 kHz to about 162 MHz.

Small concentrations of oxygen-containing gases may also be added in the etch chamber to improve the etch rate. At greater concentrations of up to about 20% O2, there is more rapid etching of first BARC layer 90 and the subsequent etching of low-k dielectric layer 30. In one exemplary embodiment for the BARC open step, the etchant gases consist of O2/$C_xF_y$/Ar with O2 part to $C_xF_y$ and Ar being about 1:1-10:1-1000, with a chamber pressure of from about 1 mTorr to about 1 Torr, at a temperature of about 60 to 200° C., at a radio frequency power to sustain plasma of from about 100 watts to about 5000 watts and at a radio frequency power to control ion bombardment from about 100 watts to about 5000 watts.

As the first patterned photoresist layer 100 erodes during the plasma dry etch process, carbon from the first patterned photoresist layer 100 reacts with the etchant gases to form polymer 110 which deposits along the top and sidewalls of first patterned photoresist layer 100 and on the partially etched first BARC layer 90. By keeping the ion bombardment low in the polymer deposition step, polymer deposition on the bottom of etched first BARC layer 90 is reduced. A benefit of polymer formation on the sidewalls of first patterned photoresist layer 100 is that polymer 110 reduces photoresist degradation during the etching process. This is important to reproduce the image of the patterned photoresist layer 100 on the substrate 10 with a high degree of integrity.

Oxygen containing gases are also added in the etch chamber to control the rate of polymer formation thereby achieving better step coverage of the etched feature. The amount of polymer deposited on the sidewalls of opening 102 may be controlled by adjusting the flow rate of oxygen containing gases, the etching time and the deposition time as is known to those skilled in the art. In one exemplary embodiment for polymer deposition, the gases consist of O2/CxHyFz/Ar with O2 part to CxHyFz and Ar being about 1:1-10:1-1000, with a chamber pressure of from about 1 mTorr to about 1 Torr, at a temperature of about 60 to 200° C., at a radio frequency power to sustain plasma of from about 100 watts to about 5000 watts and at a radio frequency power to control ion bombardment from about 0 watt to about 300 watts.

Buffer gases such as Ar, He, Kr, and Xe may also be optionally added to the etchant gases for diluent and ion density control. Argon, for example, has a relatively high mass that is used for physical etching (sputtering). Helium, on the other hand, has a low mass and is used to diminish the etchant gas concentration (referred to as a diluent) to enhance plasma uniformity. The respective gas flow rates and etching parameters are optimized by etchant and parameter selection to obtain high etch rate selectivities for the first BARC layer 90 with respect to the first patterned photo resist layer 100. These optimization procedures are well-known to those skilled in the art.

The process of partial etching and subsequent polymer formation is repeated to form first opening 102 in first BARC layer 90. When these processes are continued, first opening 102 is formed through low-k dielectric layer 30 up to etch stop layer 20 as depicted in FIG. 8. Polymer 110 formed in first opening 102 produces a highly anisotropic via hole because it blocks the etching of the sidewall of first opening 102, thus increasing the etch directionality. The end result is the formation of smooth, near vertical opening 102 and thus better control of critical dimensions of patterned structures having high aspect ratios. Once etch is complete, polymer 110, first patterned photoresist layer 100 and first BARC layer 90 are subsequently removed by conventional methods, such as, for example, wet strip or plasma ashing. These procedures are well-known by those skilled in the art and widely practiced.

Figure 9:
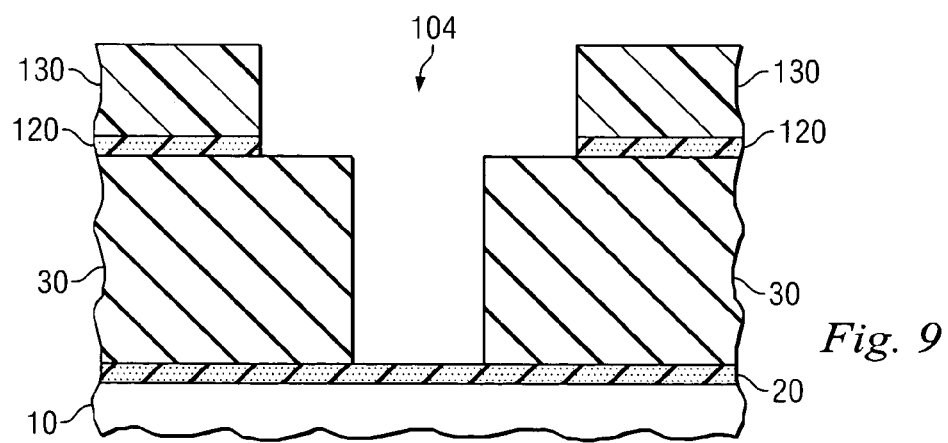
FIG. 9 is a schematic cross-sectional view of the structure of FIG. 8 showing a second patterned photoresist layer and second BARC layer formed upon the etched through low-k dielectric layer according to one embodiment of the present invention.

With the formation of the via hole of the dual damascene structure, the next processes form the trench of the damascene structure. As shown in FIG. 9, a second BARC layer 120 is deposited over low-k dielectric layer 30 and in first opening 102 by conventional spin coating methods. Second BARC layer 120 is typically deposited on the wafer as a thin layer, typically from about 200 to 2000 angstroms. Next, a second photoresist layer 130 is deposited by conventional methods such as spin coating on second BARC layer 120 and in first opening 102 at a thickness from about 1000 angstroms to about 1 µm. The second photoresist layer 130 is then patterned to define second opening 104 using well-known photolithographic processes, preferable high resolution (less than 0.25) deep UV (DUV) photolithography for optimum pattern resolution. Second patterned photoresist layer 130 will subsequently be employed as an etch mask in an etch chamber to form opening 104 in second BARC layer 120 and partially in low-k dielectric layer 30 according to design parameters to define the trench of the dual damascene structure.

Figure 10:
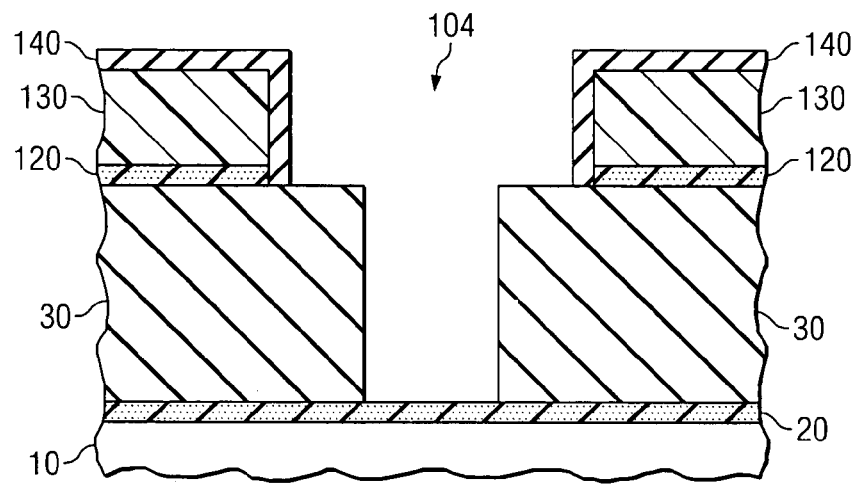
FIG. 10 is a schematic cross-sectional view of the structure of FIG. 9 showing polymer layer formation on top of the second patterned photoresist layer and on the sidewalls of the second patterned photoresist and the second BARC layers according to one embodiment of the present invention.
Figure 11:
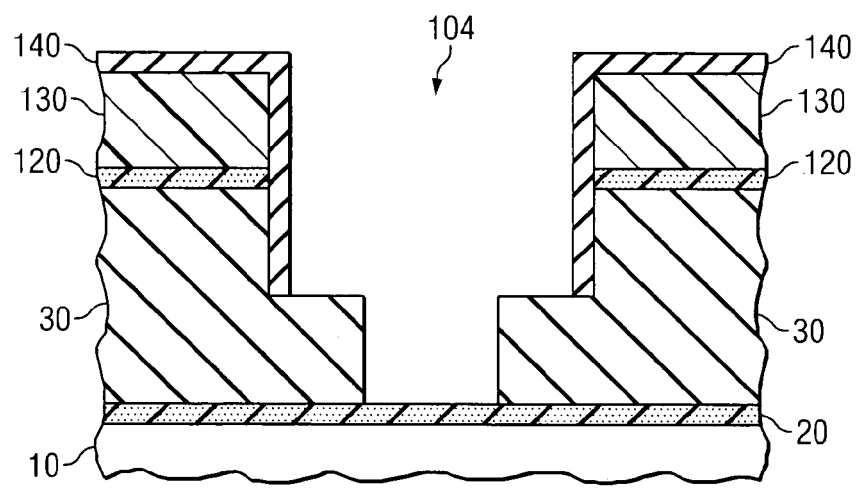
FIG. 11 is a schematic cross-sectional view of the structure of FIG. 10 showing the partial etching through of the low-k dielectric layer and subsequent polymer layer formation on the sidewalls of the low-k dielectric layer according to one embodiment of the present invention.
Figure 12:
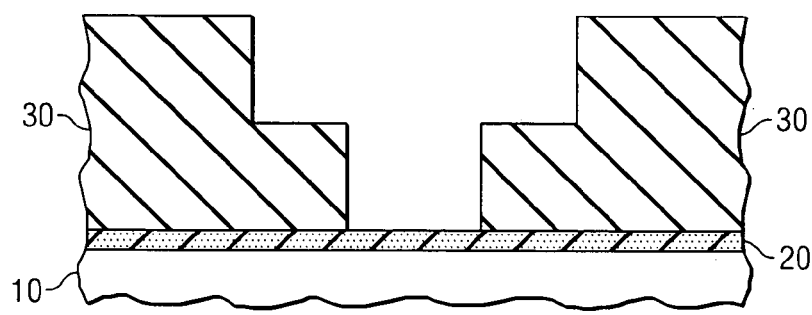
FIG. 12 is a schematic cross-sectional view of the structure of FIG. 11 showing the removal of the second patterned photoresist layer, the second BARC layer and the polymer layer according to one embodiment of the present invention.

The dual damascene structure is next loaded into an etch chamber such as a plasma dry etch chamber. As discussed above with regards to FIG. 8, the respective etchant gas flow rates and etching parameters are optimized by etchant and parameter selection. These optimization procedures are well-known to those skilled in the art. As the second patterned photoresist layer 130 erodes during dry plasma etch, carbon from the second patterned photoresist layer 130 reacts with the etchant gases to form polymer 140 which deposits along the top of second patterned photoresist layer 130 and on the sidewalls of opening 104, as shown in FIG. 10. The processes of partial etching and subsequent polymer formation is repeated to form second opening 104 in low-k dielectric layer 30 to define the trench of the dual damascene structure as depicted in FIG. 11. The end result is the formation of deep near vertical openings 102 and 104 defining the via hole and trench, respectively, to ensure critical dimension and profile control. Once etch is complete, polymer 140, second patterned photoresist layer 130 and second BARC layer 120 are subsequently removed by conventional methods, such as, for example, wet strip or plasma ashing. These procedures are well-known by those in the art and widely practiced. FIG. 12 shows the familiar dual damascene structure after having undergone the repeated processes of etching and polymer formation.

The exemplary embodiments of the present invention teach the formation of sub-quarter micron openings such as via, contact, trench, and damascene openings using high resolution DUV photolithography. Using a patterned photoresist layer as a mask for etching a BARC and an insulating layer, and by employing the repeated processes in an etching chamber of partial etching and polymer formation along the sidewalls of the opening, the dimensional integrity of the mask will be maintained to yield deep near vertical openings in the insulating layer having high aspect ratios.

While the present invention has been described with reference to specific exemplary embodiments thereof, it will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method for forming an opening in a semiconductor device comprising:
    forming an anti-reflective coating (ARC) layer above an insulation layer of a substrate;
    forming a patterned photoresist layer including at least one opening therein above the ARC layer;
    etching the ARC layer and the insulation layer in a process comprising:
        introducing a first gas including fluorocarbon gas for etching and polymer formation;
        introducing a second gas containing oxygen for polymer formation control; and
        partial etching the ARC layer defined by the at least one opening and subsequently forming a polymer layer on the inside of the at least one opening.

2. The method of claim 1, further comprising:
    repeating the step of partial etching and polymer formation to form the at least one opening in the ARC layer; and
    continuing the step of partial etching and polymer formation to form the at least one opening in the insulation layer.

3. The method of claim 1, wherein the opening includes a contact.

4. The method of claim 1, further comprising forming an etch stop layer above the substrate prior to the step of forming the insulation layer.

5. The method of claim 4, further comprising:
removing the photoresist layer and the ARC layer; and
continuing the step of partial etching and polymer formation to form the at least one opening in the etch stop layer, such that a conductive layer is subsequently formed in the at least one opening in the insulation layer and the etch stop layer to electrically contact an active region of a transistor.

6. The method of claim 1, wherein the insulation layer includes an interlayer dielectric (ILD).

7. The method of claim 1, wherein the fluorocarbon gas comprises CxFy, whore x ranges from 0 to 9 and y ranges from 0 to 9.

8. The method of claim 1, wherein the fluorocarbon gas comprises CxHyFz, where x ranges from 0 to 9, y ranges from 0 to 9, and z ranges from 0 to 9.

9. The method of claim 1, wherein the second gas is selected from the group consisting of O2, CO, CO2, NO, N2 and NO2, 10. The method of claim 1, further comprising: introducing a third gas for diluent and ion density control selected from the group consisting of Ar, He, Kr, and Xe.

11. The method of claim 1, wherein the photoresist layer and the ARC layer are subsequenily removed such that a conductive layer is subsequently formed in the at least one opening in the insulation layer to electrically contact an active region of a transistor.

12. The method of claim 1, wherein the opening includes a via.

13. The method of claim 1, wherein the insulation layer includes an intermetal dielectric (IMD).

14. The method of claim 1, wherein the photoresist layer and the ARC layer arc subsequently removed such that a conductive layer is subsequently formed in the at least one opening in the insulation layer to electrically contact a metal layer formed above the substrate.

15. A method for forming an opening in a semiconductor device comprising:
forming a first anti-reflective coating (ARC) layer above an insulation layer of a substrate;
forming a first photoresist layer having a first patterned opening therein;
etching the first ARC layer arid the Insulation layer in a precess comprising:
introducing a first gas including fluorocarbon gas for etching and polymer formation;
introducing a second gas containing oxygen far polymer formation control;
partial etching the first ARC layer defined by the first patterned opening and subsequently forming a polymer layer on the inside of the first patterned opening;
repeating the step of partial etching and polymer formation to form the first patterned opening in the first ARC layer,
continuing the step of partial etching and polymer formation to form the first patterned opening in the Insulation layer;
removing the first photoresist layer and the first ARC layer;
forming a second ARC layer above the insulation layer;
forming a second photoresist layer having a second patterned opening therein;
etching the second ARC layer and the insulation layer in a process comprising:
introducing the first and second gas;
partial etching the second ARC layer defined by the second patterned opening and subsequently forming a polymer layer on the inside of the second patterned opening;
repeating the step of partial etching and polymer formation to form the second patterned opening in the second ARC layer; and
continuing the atop of partial etching and polymer formation to form the second patterned opening in the insulation layer.

16. The method of claim 15, wherein the opening includes a dual damascene opening.

17. The method of claim 15, wherein the first patterned opening is a via.

18. The method of claim 15, wherein the second patterned opening is a trench.

19. The method of claim 15, further comprising forming an etch stop layer prior to the step of forming the insulation layer.

20. The method of claim 19, further comprising:
removing the first photoresist layer and the first ARC layer; and continuing the atop of partial etching and polymer formation to form the first patterned opening in the etch stop layer, such that a conductive layer is subsequently formed in the first and second patterned openings in the insulation layer to electrically contact a metal layer formed above the substrate.

21. The method of claim 15, wherein the insulation layer includes an intermetal dielectric (IMD).

22. The method of claim 15, wherein the fluorocarbon gas comprises OxPy, where x ranges from 0 to 9 and y ranges from 0 to 9.

23. The method of claim 15, wherein the fluorocarbon gas comprises CxHyFz, where x range from 0 to 9, y ranges from 0 to 9, and z ranges from 0 to 9.

24. The method of claim 15, wherein the second gas is selected from the group consisting of O2, CO, CO2, NO, N2 and NO2.

25. The method of claim 21, further comprising: introducing a third gas fur diluent and ion density control selected from the group consisting of Ar, He, Kr, and Xe.

26. The method of claim 15, wherein the second photoresist layer and the second ARC layer are subsequently removed such that a conductive layer is subsequently furred in the first and second patterned openings in the insulation layer to electrically contact a metal layer formed above the substrate.

* * * * *